United States Patent [19]

Kub et al.

[11] 4,098,638

[45] Jul. 4, 1978

[54] METHODS FOR MAKING A SLOPED INSULATOR FOR SOLID STATE DEVICES

[75] Inventors: Francis J. Kub, Glen Burnie; Nathan Bluzer, Silver Spring, both of Md.

[73] Assignee: Westinghouse Electric Corp., Pittsburgh, Pa.

[21] Appl. No.: 806,400

[22] Filed: Jun. 14, 1977

[51] Int. Cl.² .......................................... H01L 21/306
[52] U.S. Cl. ..................................... 156/657; 29/579; 156/661; 357/24
[58] Field of Search ............... 156/644, 653, 657, 661, 156/662, 667, DIG. 904; 427/91; 29/578, 57 R; 357/24

[56] References Cited

U.S. PATENT DOCUMENTS

| | | | |
|---|---|---|---|
| 3,200,311 | 8/1965 | Thomas et al. | 317/234 |
| 3,483,108 | 12/1969 | Schaefer | 156/657 |
| 3,713,922 | 1/1973 | Lepselter et al. | 148/175 |
| 3,769,109 | 10/1973 | MacRea et al. | 156/3 |
| 3,825,454 | 7/1974 | Kikuchi et al. | 156/656 |
| 3,837,907 | 9/1974 | Berglund et al. | 156/8 |
| 3,842,490 | 10/1974 | Seales | 29/578 |
| 3,880,684 | 4/1975 | Abe | 156/8 |
| 3,980,508 | 9/1976 | Takamiya et al. | 29/583 |

*Primary Examiner*—William A. Powell
*Assistant Examiner*—Jerome W. Massie
*Attorney, Agent, or Firm*—H. W. Patterson

[57] ABSTRACT

A method for making a sloped insulator for use in a solid state device is also described in which the surface of the insulation layer which is oppositely disposed from the interface of the insulation layer with the semiconductor wafer is provided with areas having a controlled slope with respect to the plane of the insulation-semiconductor interface.

11 Claims, 9 Drawing Figures

4,098,638

METHODS FOR MAKING A SLOPED INSULATOR FOR SOLID STATE DEVICES

CROSS-REFERENCES TO RELATED APPLICATIONS

The subject matter of the present application is related to "A SLOPED INSULATOR CHARGE COUPLED DEVICE", Ser. No. 806,402, filed June 14, 1977 by Nathan Bluzer et al.; and "AN OVERLAPPING ELECTRODE STRUCTURE FOR SOLID STATE DEVICES", Ser. No. 806,401, filed June 14, 1977 by Nathan Bluzer.

BACKGROUND OF THE INVENTION

Field of the Invention

The present invention relates to methods for making solid state devices and, more particularly, to methods for making a sloped insulator structure overlaying a semiconductor wafer as used in solid state devices.

Background of the Invention

Recent developments in the art of solid state electronic devices have created a need for a method of making a sloped insulator structure overlaying a semiconductor wafer. For example, a sloped insulator charge coupled device has been investigated having improved transfer times between adjacent wells. The improved response times of the sloped insulator charge coupled device are a consequence of the sloped disposition of the electrodes with respect to the interface of the semiconductor wafer and an insulation layer. This sloped disposition provides a lateral, or drift field, component in the electric field produced by the elements of the electrode array. The drift field component operates as a mechanism for transferring charge carriers between adjacent wells of the charge coupled device. The sloped attitude of the elements of the electrode array is achieved by supporting these elements on sloped portions of the insulation layer. Therefore, in the manufacture of the device, the controlled production of sloped areas over selected portions of the insulation layer is essential.

It was recognized that it would be desirable to employ as few processing steps as possible to produce an overlying insulation layer with selected areas having a controlled slope. Accordingly, there was a need for an efficient method of making an insulation layer having selected areas of a predetermined slope.

SUMMARY OF THE INVENTION

In a method for making an insulation layer overlaying a semiconductor wafer for use in a solid state device, an insulation layer is formed on a semiconductor wafer. A first etching material having a substantially higher etching rate in a given solution than the insulation layer is deposited on the surface of the insulation layer that is oppositely disposed from the interface of the semiconductor and the insulation layer. Portions of the first etching material are etched to the interface of the insulation layer and the first etching material such that only selected areas of the first etching material remain, the remaining selected areas having a surface oppositely disposed from the interface of the selected area with the insulation layer, and having edge surfaces extending between the interface and the oppositely disposed surface. An etch stop is then formed to cover the surface of the selected areas of the first etching rate material that is oppositely disposed from the interface of the first etching material and the insulation layer, and also to cover edge surfaces of the selected areas of the first etching rate material between the interface and the oppositely disposed surface. Such etching solutions can thereafter attack only exposed edge surfaces of the selected areas of the first etching material. An etching solution is then applied to the exposed surfaces of the insulation layer and the first etching material to simultaneously etch the insulation layer and the first etching material laterally along the interface of the insulation layer and the first etching material. Due to the higher etching rate of the first etching material in comparison to the etching rate of the insulation layer, a sloped area is etched into the surface of the insulation layer said sloped area having a lateral extent substantially equal to the lateral extent of the interface between the insulation layer and the selected area of said first etching material. The degree of slope of the sloped area is determined by the differential etching rate of the first etching material and the insulation layer in a given etching.

DESCRIPTION OF THE PREFERRED EMBODIMENTS

Figure 1:
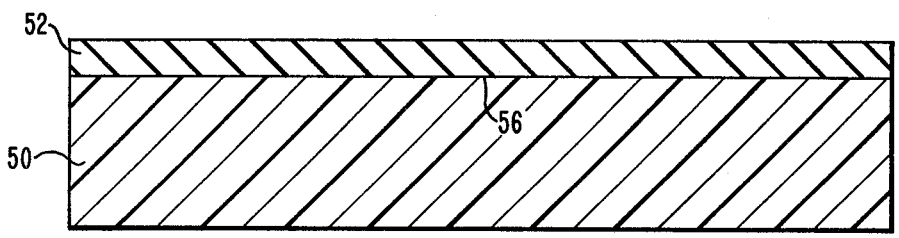
FIG. 1 shows the first step in the disclosed method for making an insulator having sloped areas in a surface oppositely disposed from an insulation-semiconductor interface in which an insulation layer of silicon dioxide is thermally grown on a semiconductor wafer.

In accordance with the present invention, an improved method for making an insulation layer that is useful in solid state devices is described in relation to FIGS. 1 through 9, said insulation layer having oppositely disposed surfaces in which one of the surfaces includes first areas that are sloped with respect to the plane of the oppositely disposed surface. In FIG. 1, a semiconductor wafer 50 which, for the example of the preferred embodiment, is comprised of silicon (Si), is provided with an insulation layer 52 to form a semiconductor-insulation layer interface 56. For the present example, the insulation layer is comprised of silicon dioxide (SiO$_2$) which is thermally grown on the silicon wafer by exposing the silicon to an oxygen atmosphere at approximately 1100° C for a time of about 1 hour. Typically, the silicon dioxide layer is 4-10kÅ thick.

Figure 2:
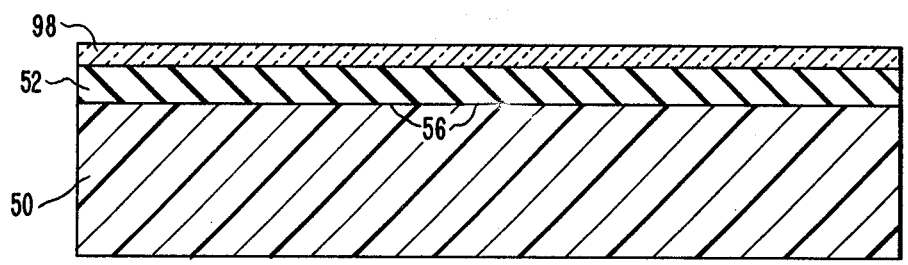
FIG. 2 illustrates the further step of depositing, on the surface of the insulator, a first etching material of phosphorous glass having a higher etch rate than the insulation layer.

FIG. 2 shows the addition of a first etching material to the structure of FIG. 1. The first etching material may, for example be a phosphorus silicate glass layer 98 which is applied to the surface of the insulation layer 52 that is oppositely disposed from the semiconductor-insulation layer interface 56. The phosphorus glass layer 98 is applied by the process of gaseous deposition. Alternatively, phosphorus doped oxide or deposited polysilicon could be substitute for the deposited phosphorus silicate glass layer.

Figure 3:
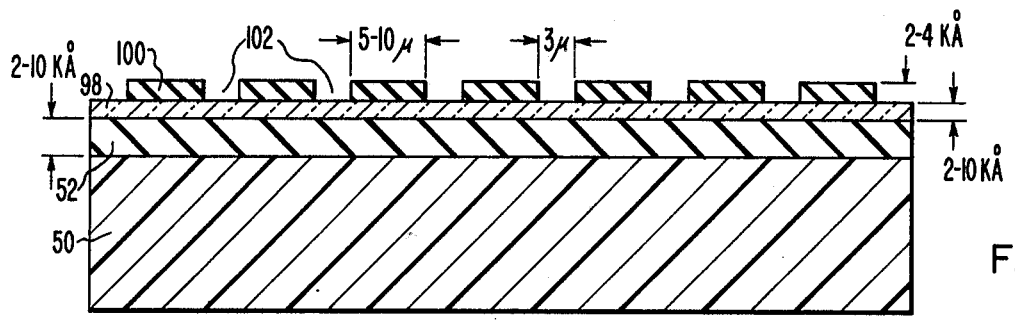
FIG. 3 shows the addition of a photoresist layer in which windows have been defined in selected areas to expose portions of the phosphorus glass layer.
Figure 4:
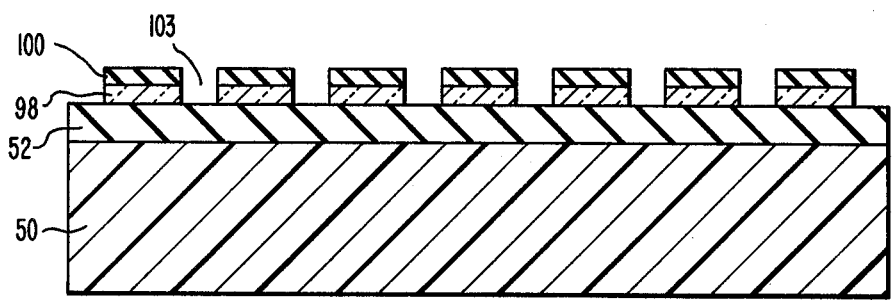
FIG. 4 shows the structure of FIG. 3 after being immersed in an etching solution which attacks the phosphorus glass layer.
Figure 9:
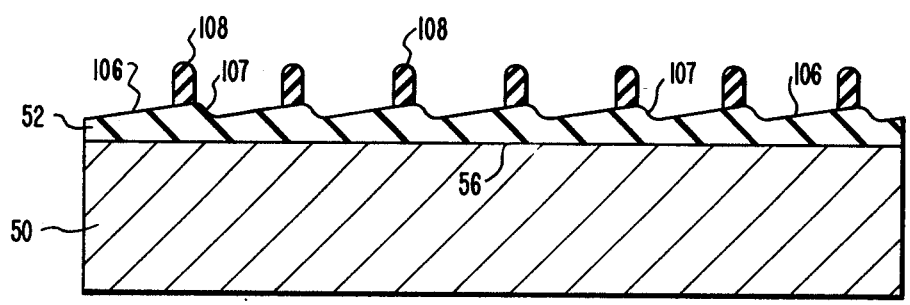
FIG. 9 illustrates the remaining structure after the structure of FIG. 8 has been exposed to an etching solution with etch stop material remaining.

As shown in FIG. 3, a layer of commercially available photoresist 100 is spun over the surface of the phosphorus glass layer 98 and windows 102 are defined in the photoresist layer 100 by covering the photoresist layer 100 with an appropriate photographic mask and illuminating through the photolithographic mask. Typically, the lateral dimension of the windows in the photoresist mask will be approximately 3 $\mu$ and the distance between adjacent windows will be on the order of 5-10 $\mu$. Also, the phosphorus glass and photoresist layers each have a typical thickness in the range of 2-10kÅ. The structure of FIG. 3 is then exposed to an etching solution which will attack the exposed portions of the phosphorus glass layer 98. One example of such a solution is a mixture of 10 parts water (H$_2$O) to one part hydrogen fluoride (HF). The etch rate of phosphorus silicon glass in the water-hydrogen fluoride mixture is approximately 5-10 kÅ/min. If phosphorus doped oxide is substituted for the phosphorus silicate glass, it would have a similar etching rate. If deposited polysilicon is substituted for the phosphorus silicate glass, an etching solution of acetic acid, nitric acid and hydrogen fluoride would be used in which the polysilicon would have an etch rate of approximately 15 kÅ/min. As illustrated in FIG. 9, the etching process is continued until the portions of the phosphorus glass layer 98 exposed through the window 102 of the photoresist layer 100 are etched away to expose the underlying areas of the silicon dioxide layer 52 thus forming an array of channels 103 in the phosphorus glass layer 98. FIG. 4 shows that, as a consequence of etching the channels 103 into the phosphorus glass layer 98, the remaining portions of the phosphorus glass layer 98 can be described as having an upper surface that is oppositely disposed from the interface of the phosphorus glass layer 98 with the insulation layer 52, and as also having edge surfaces extending between said upper surface and said interface, said edge surfaces comprising one sidewall of the channel 103.

Figure 5:
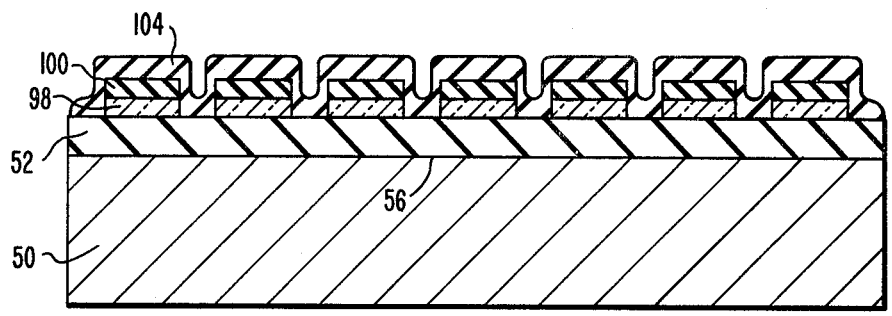
FIG. 5 shows the addition of a second photoresist layer to the exposed portions of the silicon dioxide, phosphorus glass and first photoresist layers.
Figure 6:
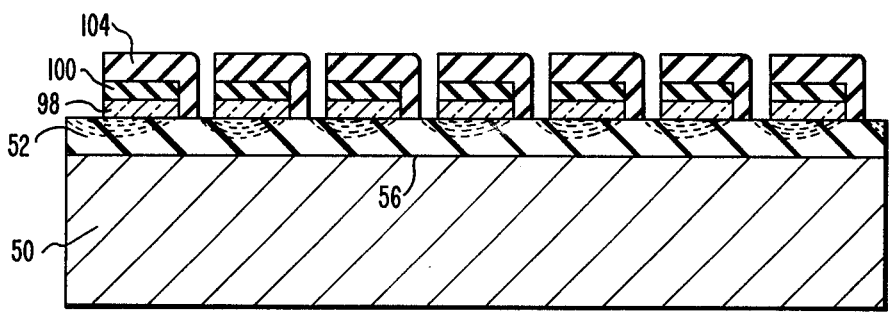
FIG. 6 shows the definition of windows in the second photoresist layer to form an etch stop that masks selected surfaces of the structure of FIG. 3.

As described in relation to FIGS. 5 and 6, an etch stop is then formed over one edge surface of the phosphorus glass layer 98 and a portion of the surface of the insulation layer 52 exposed in the channel 103, and over the surface of the remaining portions of the phosphorus glass layer 98 oppositely disposed from the interface between the phosphorus glass layer 98 and the insulation layer 52.

As shown in FIG. 5, a second photoresist layer 104 is spun over the exposed surfaces of the insulation, phosphorus glass, and first photoresist layers 52, 98 and 100 respectively. As further shown in FIG. 6, windows are etched in selected portions of the second photoresist layer 104 to expose areas of the silicon dioxide layer 52 which include part of the areas of the silicon dioxide layer 52 that were exposed through the window 102 of the first photoresist layer 100 and through the channels 103 of the phosphorus glass layer 98. As also shown in FIG. 6, the remaining portions of the second photoresist layer 104 cover the upper surface of the first photoresist layer 100 parts of the areas in the exposed SiO$_2$ layer 52, and also the edge surface of the phosphorus glass layer 98 which was exposed along one sidewall of the channel 103 etched in the phosphorus glass layer 98. These remaining portions of the second photoresist layer 104 cooperate with the remaining portions of the first photoresist layer 100 to comprise etch stops which protect one edge of the channel 103 in the phosphorus glass layer 98 from attack by an etching solution during the next step of the disclosed process.

In the next step of the process, the structure of FIG. 6 is exposed to an etching solution which will attack both the phosphorus glass layer 98 and the insulation layer 52. In the present example, the etching solution of a mixture of ten parts water to one part hydrogen fluoride is again used. The etch rate of the thermally grown silicon dioxide in this etching solution is approximately 650 Å/min. Comparison of the etching rate of the thermally grown silicon dioxide with the etching rate of the phosphorus glass shows that the etching rate of the phosphorus glass is approximately 10 times the etching rate of the thermally grown silicon dioxide. Due to the differential in these etching rates when the respective layers are exposed to the same etchant, the progress of the etching through the phosphorus glass layer 98 in a direction lateral to the semiconductor-insulation interface 56 will proceed much faster than the etching of the silicon dioxide layer 52 in a direction normal to the semiconductor-insulation interface 56. Accordingly, the etching will occur in a lateral direction along the semiconductor-insulation interface 56 with etching of the insulation layer 52 in a direction normal to the interface 56 resulting in sloped areas 106 being etched into the surface of the insulation layer, the lateral extent of said sloped areas 106 being substantially equal to the lateral extent of the interface between the remaining portions of the phosphorus glass layer 98 and the insulation layer 52. As is now apparent, the sloped areas 106 result as a consequence of the lateral etching time gradient along the insulation-phosphorus glass interface which stems from the differential etching rate of the insulation and phosphorus glass layers in a given etching solution. That is, since the etch stop formed by the photoresist layers 100 and 104 prevents etching along the insulator-phosphorus glass interface in one direction, the time for which a point on the surface of the insulation layer is exposed to the etching solution is a monotonically decreasing function of the distance between the nearest etch stop and the surface point along the insulator-phosphorus glass interface. This controlled deviation in the etching time for various points on the surface of the insulation layer 50 results in the etching of the sloped areas 106. The etching that occurs is illustrated by the dashed lines of FIG. 6.

Figure 7:
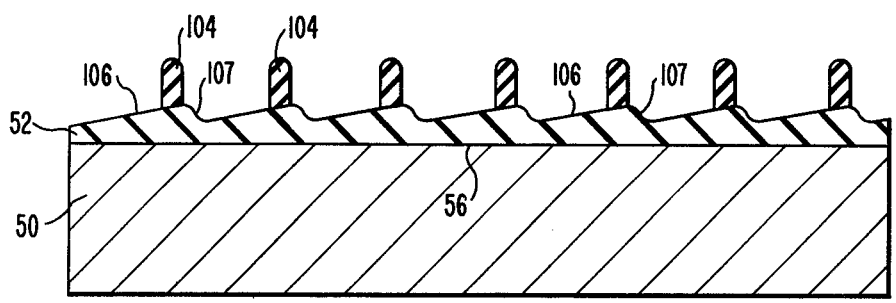
FIG. 7 shows the resulting structure after the structure of FIG. 6 has been exposed to an etching solution which attacks both the phosphorus glass and insulation layers.

After the remaining portions of the phosphorus glass layer 98 have been etched completely away, the structure will appear substantially as shown in FIG. 7 with the surface of the insulation layer 52 having first areas 106 which are sloped with respect to the semiconductor-insulator interface 56 and second areas 107 alternately disposed between said first areas. Typically, the distance between the semiconductor-insulation layer interface 56 and the surface of the insulation layer 52 for opposite ends of the sloped areas 106 will vary in the range of 1–10 kÅ in a direction normal to the interface 56. Exemplary distances for the distance of sloped area 106 from the interface 56 are 0.4 micrometers for the farthest point and 0.1 micrometers for the closest point where the sloped area 106 extends for approximately eight micrometers along the interface 56.

FIG. 7 also shows that portions of the second photoresist layer 104, which comprised the etch stops of the structure of FIG. 6, remain after the etching process is performed. These remaining portions of the photoresist layer 104 may be used in further development of the solid state device, e.g., electrodes for a CCD or may be removed by a commercially available developer as the particular need requires.

In an experimental test of the method described in FIGS. 1 through 7 in which phosphorus doped silox was used for forming the phosphorus silicate glass 98, a sloped oxide structure was obtained in which the degree of slope of the sloped areas 106 of the silicon dioxide 52 was observed to be approximately 9° with respect to the semiconductor-insulator interface 56. This observed slope is substantially equivalent to the theoretically predicted slope.

Figure 8:
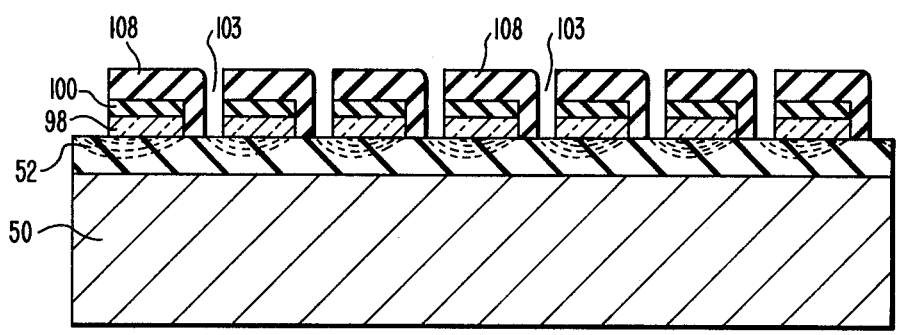
FIG. 8 represents an alternative method for making the disclosed insulation layer in which etch stops are formed by evaporating a metal onto selected surfaces of the structure of FIG. 3.

FIGS. 8 and 9 illustrate an alternative method for making the etch stops used in making the insulation layer having sloped area 106 as previously described. In this alternative method, a structure is built in accordance with the method previously described in relation to FIGS. 1 through 4. Then, as shown in FIG. 8, when this structure is completed, etch stops are provided along top surface of the PSG, parts of the SiO$_2$ 52 and one sidewall of the channels 103 in the phosphorus glass layer 98 to protect the corresponding edge surface of the phosphorus layer 98 from attack when exposed to an etching solution. The etch stop is provided by shadow evaporating a metal 108 along one sidewall of the channels 103 in the phosphorus glass layer 98. The shadow evaporated metal cooperates with the photoresist layer 100 to form etch stops which function similar to the etch stops formed by the cooperation of the remaining portions of the photoresist layers 100 and 104 are previously described with respect to FIG. 6. As will be apparent to those skilled in the art, the photoresist layer 100 can be removed prior to the evaporation of the metal etch stop as described in relation to FIG. 8. In this case, the evaporated metal forms the complete etch stop which protects the top surface and at least one side of the phosphorus glass layer 98 from attack by an etching solution.

Similar to the previously described method, the structure shown in FIG. 8 is then exposed to an etching solution which will attack the exposed surfaces of both the phosphorus glass layer 98 and the silicon dioxide layer 52. As was also explained previously, due to the differential etching rates of these two materials, the sloped areas 106 will be formed along the surface of the silicon dioxide 52 which is oppositely disposed from the semiconductor-insulation layer interface 56 as illustrated in FIG. 9. The sloped areas 106 are separated by the second areas 107 which are alternately disposed between the first areas 106. The second areas 107 include portions of the metal etch stops that were shadow evaporated onto the structure shown in FIG. 4 as described in relation to FIG. 8. Analogously to the process described with respect to FIG. 7, the remaining portions of the metal 108 may be used in further development of the solid state device, or may be removed as the particular application may require.

Although specific materials and dimensions have been suggested in the foregoing methods for making an insulation layer having sloped areas as described herein, the specific materials and dimensions set forth above are intended as illustrative as it is recognized that equivalent materials can be substituted and other dimensions may be more suitable for a particular application of the method. In the foregoing description, improved methods for making an insulation layer having oppositely disposed surfaces with one of said surfaces including areas that are sloped with respect to the plane of the other oppositely disposed surface have been disclosed, said method reducing the number of processing steps necessary to produce the described insulation layer structure. Accordingly, these methods afford a more efficient and economical production of the described insulation layer structure.

We claim:

1. A method for making an insulation layer for use in a solid state device, said insulation layer having one surface that includes first areas that are sloped with respect to the plane of another surface of said insulator layer that is oppositely disposed from said one surface, said one insulator layer surface also including second areas alternately disposed between said first areas, said method including the steps of:

depositing a layer of etching rate material on the one surface of the insulation layer, said etching rate material having a substantially higher etching rate than said insulation layer in a given etching solution, forming channels through selected portions of said fast etching material;

forming an etch stop along a portion of the sidewalls of each of said channels in said fast etching material and over the surface of said fast etching material that is oppositely disposed from the interface of said fast etching material with said insulation layer, etching the insulation layer in a direction normal to the plane of the another surface while simultaneously etching the edge surface of said fast etch rate material along the exposed portion of the sidewalls of said channel laterally with respect to the plane of the another surface such that the one surface of the insulation layer includes first areas that are sloped with respect to the another surface, the one surface of the insulation layer also including second areas that support said etch stops.

2. The method of claim 1 wherein said step of forming an etch stop along a portion of the sidewalls of each of said channels includes:

depositing a layer of etch stop material over the exposed surfaces of said insulation layer and said fast etching material; and defining channels in said etch stop material, said channels coinciding with a portion of the channels in said fast etching material such that the remaining portions of said etch stop material cover a portion of the sidewalls of each of said channels in said fast etching material, the channels in said etch stop material exposing another portion of the sidewalls of each of said channels in said fast etching rate material and a portion of the surface of the insulator included in the channel of said fast etching rate material.

3. The method of claim 1 wherein said step of forming an etch stop along a portion of the sidewalls of each of said channels includes:

shadow evaporating an etch stop material onto a portion of the sidewalls of each of said channels, another portion of the sidewalls of each of said channels being shadowed from the etch stop material due to the angle of evaporation.

4. A method for making an insulation layer for use in a solid state device, said insulation layer having one and another surfaces that are oppositely disposed from each other, said another surface being planar and said one surface including first areas that are sloped with respect to the another surface of said insulation layer, said method including the steps of:

depositing an etching material on the insulation layer to provide a bilayer structure of insulation and etching material, the etching rate of said etching material being substantially greater than the etching rate of said insulation layer in a given etching solution;

depositing a first layer of photoresist material on said bilayer structure;

defining a window in the first layer of photoresist;

etching the etching material exposed through the photoresist window until the underlying insulation layer is exposed to form a channel in said etching material;

depositing a second layer of photoresist material over the exposed surfaces of the insulation layer and the etching material;

defining a channel in the second layer of photoresist material, said photoresist channel partially covering the channel in the etching material, the remaining portions of the second photoresist layer cooperating with the remaining portions of the first photoresist layer to provide an etch stop that covers the edge surface of the etching material along a portion of the sidewalls of the channel in the etching material and that also covers the surface of the etching material that is oppositely disposed from the interface of the etching material with the insulation layer; and etching the insulation layer in a direction normal to the another surface of said insulation layer, and etching the exposed portion of the sidewalls of the etching material laterally with respect to the another surface of said insulation layer such that the exposed surface of the bilayer structure is sloped with respect to the another surface of the insulation layer.

5. A method for making an insulation layer for use in a solid state device said method comprising:

forming an insulation layer on a semiconductor wafer to form a planar semiconductor-insulation interface between the semiconductor wafer and the insulation layer;

depositing an etching material on the surface of the insulation layer that is oppositely disposed from the semiconductor-insulation interface to form an insulation-etching material interface, said etching material having an etching rate that is substantially higher than the etching rate of the insulation layer in a given etching solution;

spinning a first layer of photoresist on the surface of said etching material that is oppositely disposed from the insulation-etching material interface;

defining windows in the first layer of photoresist said windows exposing selected areas of the etching material;

etching portions of the etching material exposed through the photoresist windows to the insulation-etching material interface to form a channel in said etching material;

spinning a second layer of photoresist over the first layer of photoresist and the exposed surfaces of the insulation and etching material layers;

defining a channel in said second photoresist layer to expose a portion of the channel etched in the etching material, the remaining portions of the second photoresist layer cooperating with the remaining portions of the first photoresist layer to form an etch stop that covers the edge surface of the etching material along one sidewall of the etching material channel; and etching the exposed surfaces of said etching material and said insulation layer simultaneously by exposure to said given etching solution until sloped areas that are sloped with respect to the plane of the semiconductor-insulation interface are etched into the surface of said insulation layer that is oppositely disposed from said semiconductor-insulation interface as a result of the different etching rates of said etching material and said insulation layer, said sloped areas being located between the channels of the second photoresist layer.

6. The method of claim 5 wherein the etching rate of the etching material is approximately ten times higher than the etching rate of the insulation layer in a given etching solution.

7. A method for making an insulation layer for use in a solid state device having a semiconductor wafer attached to one planar surface of the insulation layer, said insulation layer having another surface which is oppositely disposed from said one surface and which includes first areas that are sloped with respect to the plane of said one surface, said method comprising:

forming an insulation layer on a semiconductor wafer to form a planar semiconductor-insulation interface between the semiconductor wafer and the insulation layer;

depositing a layer of etching material on the surface of the insulation layer that is oppositely disposed from the semiconductor-insulation interface to form an insulation-etching material interface, said etching material having an etching rate that is substantially higher than the etching rate of the insulation layer when the etching material and insulation layer are simultaneously exposed to a given etching solution;

spinning a first layer of photoresist on the surface of the layer of etching material that is oppositely disposed from the insulation-etching material interface;

defining a window in the first layer of photoresist to expose selected areas of the etching material;

etching portions of the layer of etching material exposed through the photoresist window to the insulation-etching material interface to form a channel in said etching material;

spinning a second layer of photoresist on the first layer of photoresist and on the exposed surfaces of the insulation and etching material layers;

defining a channel in the second layer of photoresist material, a portion of said photoresist channel coinciding with a portion of the channel etched in the layer of etching material, the remaining portions of the second photoresist layer cooperating with the remaining portions of the first photoresist layer to provide an etch stop that covers the edge surface of the etching material along one sidewall of the etching material channel, and that also covers the surface of the etching material that is oppositely disposed from the insulation-etching material interface; and etching exposed surfaces of the insulation and etching material layers simultaneously to provide said sloped areas in said one surface of said insulation layer as a result of the different etching rates of said etching material and said insulation layer.

8. A method for making an insulation layer for use in a solid state device, said method comprising:

forming an insulation layer on a semiconductor wafer to form a planar semiconductor-insulation interface between the semiconductor wafer and the insulation layer;

depositing a layer of etching material on the surface of the insulation layer that is oppositely disposed from the semiconductor-insulation interface to form an insulation-etching material interface, said etching material having an etching rate that is substantially higher than the etching rate of the insulation layer in a given etching solution;

spinning a layer of photoresist on the surface of the layer of etching material that is oppositely disposed from the insulation-etching material interface;

defining a window in the photoresist said window exposing a selected area of the surface of the etching material;

etching portions of the layer of etching material exposed through the photoresist window to the insulation-etching material interface to form a channel in said etching material;

shadow evaporating an etch stop material onto selected surfaces of the photoresist, the etching material and the insulation layer to form an etch stop that covers the edge surface of the etching material along one sidewall of the etching material channel; and etching the exposed surfaces of said insulation and etching material layers simultaneously by exposure to said given etching solution to provide sloped areas in the surface of said insulation layer that is oppositely disposed from the semiconductor-insulation interface as a result of the different etching rates of said etching material and said insulation layer, said sloped areas being disposed substantially with a plane that intersects the plane of the semiconductor-insulation interface.

9. The method of claim 8 wherein the etching rate of the etching material is approximately ten times higher than the etching rate of the insulation layer in a given etching solution.

10. A method for making an insulation layer for use in a solid state device having a semiconductor wafer attached to one planar surface of the insulation layer, said insulation layer having another surface which is oppositely disposed from said one surface and which includes first areas that are sloped with respect to the plane of said one surface, said method comprising:

forming an insulation layer on a semiconductor wafer to form a planar semiconductor-insulation interface between the semiconductor wafer and the insulation layer;

depositing an etching material on the surface of said insulation layer that is oppositely disposed from the semiconductor-insulation interface to form an insulation-etching material interface, said etching material having an etching rate that is substantially higher from the etching rate of said insulation layer when the etching material and insulation layer are simultaneously exposed to a given etching solution;

spinning a layer of photoresist over the surface of the etching material that is oppositely disposed from the insulation-etching material interface;

defining a window in said photoresist to expose selected areas of said etching material within the photoresist window;

etching the exposed portions of said etching material to the insulation-etching material interface to form a channel in the etching material;

shadow evaporating an etch stop material onto selected surfaces of the photoresist, the etching material and the insulation layer to form an etch stop that covers the edge surface of the etching material along a portion of the sidewalls of the etching material channel, and that also covers the surface of the etching material that is oppositely disposed from the insulation-etching material interface; and etching the exposed surfaces of the etching material and the insulation layer simultaneously to provide sloped areas in the surface of said insulation layer that is oppositely disposed from the semiconductor-insulation interface as a result of the different etching rates of said etching material and said insulation layer, said sloped areas lying substantially within a plane that intersects the plane of the semiconductor-insulation interface at a predetermined angle.

11. A method for making an insulation layer for use in a solid state device, said method comprising:

forming an insulation layer on a semiconductor wafer to form a planar semiconductor-insulation interface between the semiconductor wafer and the insulation layer;

depositing a layer of etching material on the surface of the insulation layer that is oppositely disposed from the semiconductor-insulation interface to form an insulation-etching material interface, said etching material having an etching rate that is substantially higher than the etching rate of the insulation layer in a given etching solution;

spinning a layer of photoresist on the surface of the layer of etching material that is oppositely disposed from the insulation-etching material interface;

defining a window in the photoresist said window exposing a selected area of the surface of the etching material;

etching portions of the layer of etching material exposed through the photoresist window to the insulation-etching material interface to form a channel in said etching material;

removing the remaining portions of the layer of photoresist;

shadow evaporating an etch stop material onto selected surfaces of the etching material and the insulation layer to form an etch stop that covers the edge surface of the etching material along one sidewall of the etching material channel and that also covers the surface of the etching material that is oppositely disposed from the insulation-etching material interface; and etching the exposed surfaces of said insulation and etching material layers simultaneously by exposure to said given etching solution to provide sloped areas in the surface of said insulation layer that is oppositely disposed from the semiconductor-insulation interface as a result of the different etching rates of said etching material and said insulation layer, said sloped areas being disposed substantially within a plane that intersects the plane of the semiconductor-insulation interface.

* * * * *